US011125790B2

United States Patent
Beiner

(10) Patent No.: US 11,125,790 B2
(45) Date of Patent: Sep. 21, 2021

(54) METHOD FOR OPERATING A POWER CONSUMPTION METERING SYSTEM AND POWER CONSUMPTION METERING SYSTEM

(71) Applicant: Energybox Ltd., Hong Kong (HK)

(72) Inventor: Dirk Beiner, Hong Kong (HK)

(73) Assignee: ENERGYBOX LTD., Hong Kong (HK)

( * ) Notice: Subject to any disclaimer, the term of this patent is extended or adjusted under 35 U.S.C. 154(b) by 0 days.

(21) Appl. No.: 16/506,930

(22) Filed: Jul. 9, 2019

(65) Prior Publication Data

US 2021/0011063 A1 Jan. 14, 2021

(51) Int. Cl.
*G01R 22/06* (2006.01)
*G01R 22/10* (2006.01)
*H04L 29/08* (2006.01)
*H04Q 9/02* (2006.01)

(52) U.S. Cl.
CPC ........... *G01R 22/063* (2013.01); *G01R 22/10* (2013.01); *H04L 67/10* (2013.01); *H04Q 9/02* (2013.01); *H04Q 2209/10* (2013.01); *H04Q 2209/60* (2013.01)

(58) Field of Classification Search
CPC ............................... G01D 4/004; H02J 7/0063
USPC ...................................................... 340/870.5
See application file for complete search history.

(56) References Cited

U.S. PATENT DOCUMENTS

| | | | |
|---|---|---|---|
| 2010/0042857 A1* | 2/2010 | Zommer | G06F 1/3203 713/320 |
| 2011/0251807 A1 | 10/2011 | Rada et al. | |
| 2012/0123995 A1* | 5/2012 | Boot | H02J 13/00004 706/54 |
| 2014/0172176 A1* | 6/2014 | Deilmann | H04L 12/2827 700/275 |
| 2016/0188763 A1 | 6/2016 | Beiner | |
| 2019/0011283 A1* | 1/2019 | Soutar | H04L 67/22 |
| 2019/0264935 A1* | 8/2019 | Taylor | F24F 11/30 |

FOREIGN PATENT DOCUMENTS

DE    112015005856 T5    10/2017

OTHER PUBLICATIONS

Bouhouras, Aggelos S. et al., "Load Signature Formulation for Non-Intrusive Load Monitoring Based on Current Measurements," Energies, vol. 10, Apr. 16, 2017, 21 pages.

(Continued)

*Primary Examiner* — Fabricio R Murillo Garcia
(74) *Attorney, Agent, or Firm* — Slater Matsil, LLP

(57) ABSTRACT

In an embodiment a method for operating a power consumption metering system includes measuring, by a sensor deployed at a monitored site, power consumption values over time to obtain a high speed value pattern of a power consumption with a resolution of more than 1000 values per second, measuring, by the sensor, low speed power consumption values over time to obtain a low speed value pattern of the power consumption with a resolution of less than 100 values per second, identifying a status of a power consumer of the monitored site dependent on the high speed value pattern and counting an operation time of the power consumer dependent on the low speed value pattern and on the identified status.

22 Claims, 2 Drawing Sheets

(56) References Cited

OTHER PUBLICATIONS

Ebaid, Emad, et al., "Deducing Energy Consumer Behavior from Smart Meter Data," Future Internet, MDPI, vol. 9, Jul. 6, 2017, 25 pages.

Laughman, Christopher, et al., "Power Signature Analysis," IEEE Power and Energy Magazine, vol. 1, No. 2, Apr. 2003, 8 pages.

* cited by examiner

METHOD FOR OPERATING A POWER CONSUMPTION METERING SYSTEM AND POWER CONSUMPTION METERING SYSTEM

TECHNICAL FIELD

The disclosure relates to a method for operating a power consumption metering system and a corresponding power consumption metering system. In particular, the present disclosure relates to a power consumption metering system that allows a counting of operation time based on a power consumption pattern.

BACKGROUND

With the prospect of global climate change, energy and power consumption and corresponding carbon dioxide emission are of particular importance in all areas of technology. A relatively large proportion of primary energy is used for the operation of residential, commercial and industrial buildings, for example, for lighting and heating, ventilation and air conditioning (HVAC). It is widely recognized that energy consumption in this area is one of the biggest carbon dioxide emission driver nowadays. In order to reduce carbon dioxide emissions worldwide, apart from utilizing more clean energy sources, energy efficiency in the building sector is thus one of the best opportunities to address the problems of global climate change. This is particularly true in view of growing populations, the widespread use of electricity driven technologies and an increase in the amount of man-made buildings on the planet.

In conventional energy distribution networks, the energy consumption of a site is typically measured at a central supply point, e.g., an electricity meter installed between a supply line of an utility provider and a first distribution panel of a given site, for example, a single building or a distinct part of a building such as an apartment or the like. In this way, all electrical energy consumed at that particular site can be measured, irrespective of the electrical distribution system of the given site.

The energy consumption measured at such a central supply point is usually used by the utility provider for billing purposes. Thus, at the end of a billing period such as a month or year, the utility provider usually prepares a utility bill based on the measured total consumption and provides it to the site manager or owner. Based on the provided utility bill, a site manager or owner can then determine whether he or she has stayed within a desirable energy budget or has exceeded it.

Such a conventional approach is sufficient for billing purposes. However, in times of high energy prices and a focus on energy efficiency, the data available in such a conventional scheme is insufficient in order to maintain a control over how the energy is actually consumed within a given site and also in order to estimate, at any given time, whether given energy targets will be met.

SUMMARY

Embodiments provide a method for operating a power consumption metering system. In particular, the method comprises: —measuring power consumption values over time with a sensor deployed at a monitored site to obtain a value pattern of power consumption, —providing the value pattern to a cloud based data processing system, —identifying a status of a power consumer of the monitored site dependent on the value pattern, —counting an operation time of the power consumer dependent on the identified status.

Further embodiments provide a power consumption metering system comprising a sensor deployed at a monitored site, the sensor being configure to measure granular-level power consumption, a power consumption meter, the power consumption meter being coupled with the sensor and comprising a processor and memory storing instructions to execute in the processor, the instructions configured to determine a value pattern of power consumption dependent on sensor data provided by the sensor, a cloud based data processing system, the cloud based data processing system comprising a processor and memory storing instructions to execute in the processor, the instructions configured to identifying a status of a power consumer of the monitored site dependent on the value pattern, the power consumption metering system being configured to count an operation time of the power consumer dependent on the identified status. For example, the power consumption meter is configured to count an operation time of the power consumer and the cloud based data processing system is configured to provide information about the status of a power consumer to the power consumption meter. For example, the cloud based data processing system is configured to count an operation time of the power consumer and the cloud based data processing system is configured to provide information about the status of a power consumer to the power consumption meter.

By determining the value pattern out of the power consumption, counting of the operation time is possible without the need to have special hardware or software integrated in the power consumer itself. Only the metering information on the power consumer is required to extract the information per power consumer by the power consumption metering system. According to an embodiment, the operation time of the power consumer is counted dependent on the identified status by the cloud based data processing system. According to an embodiment, the operation time of the power consumer is counted dependent on the identified status by the power consumption meter. For example, the cloud based system identifies the criteria and have the power consumption meter locally count the operation time. The status and operation time includes, for example, an information selected from the group consisting of: an operation hour counter, a regular electrical pattern identification, an abnormal conditions detection based on deviation from pattern or consumption levels, an identification of patterns and device recognition and combinations thereof.

BRIEF DESCRIPTION OF THE DRAWINGS

The present invention will be further described with reference to the accompanying drawings, wherein.

Figure 1:
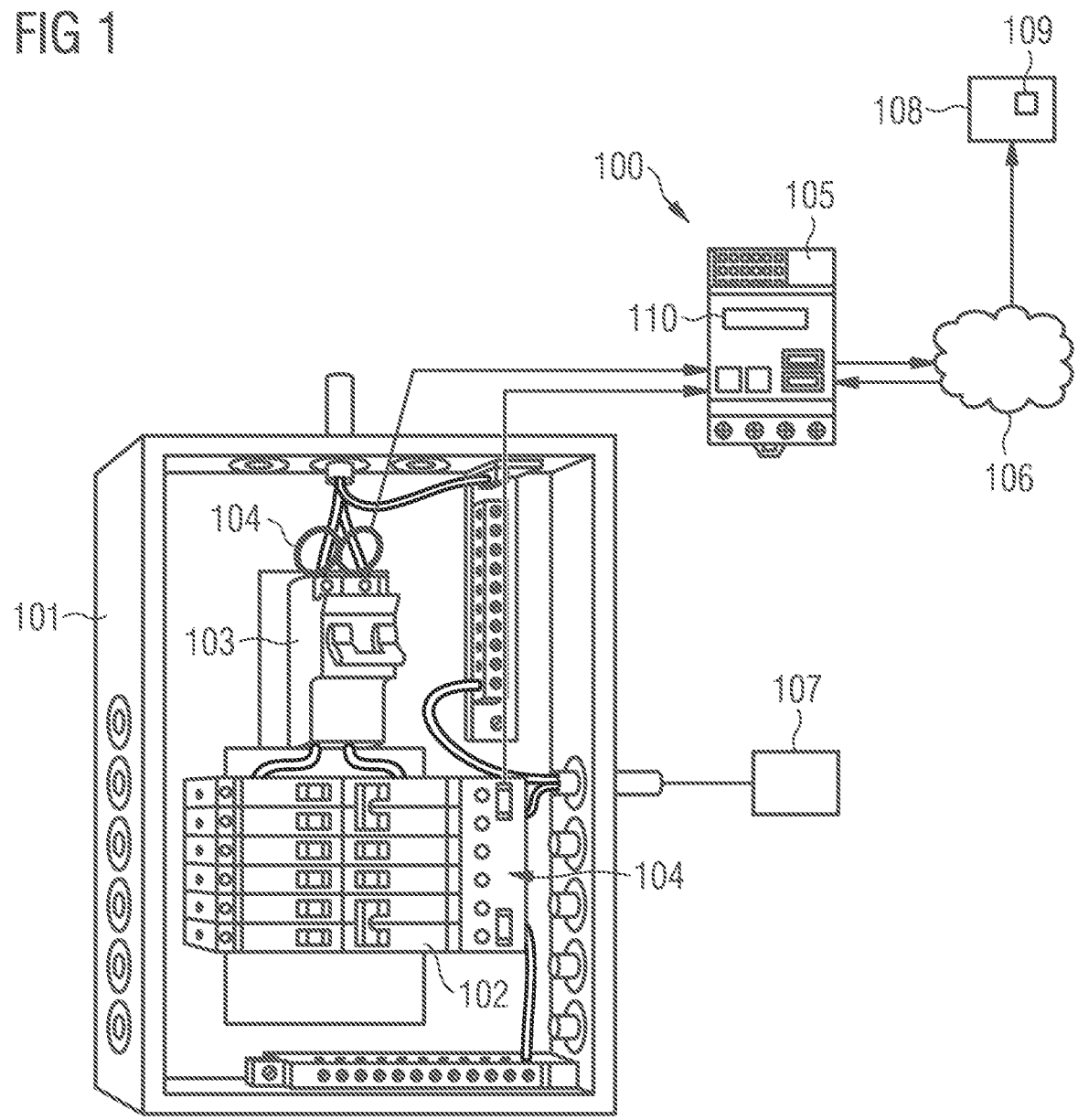
FIG. 1 shows a schematic diagram of a power consumption metering system.

While the invention is amenable to various modifications and alternative forms, specifics thereof have been shown by way of example in the drawings and will be described in detail. It should be understood, however, that the intention is not to limit the invention to the particular embodiment described. On the contrary, the intention is to cover all modifications, equivalents, and alternatives falling within the scope of the invention as defined by the appended claims.

DETAILED DESCRIPTION OF ILLUSTRATIVE EMBODIMENTS

In the following detailed description of embodiments, reference is made to the accompanying drawings, which form a part hereof and in which are shown, by way of illustration, specific embodiments in which the invention may be practiced. The illustrated embodiments are not intended to be exhaustive of all embodiments according to the invention. It is to be understood that other embodiments may be utilized and structural or logical changes may be made without departing from the scope of the present invention. The following detailed description therefore is not to be taken in a limiting sense, and the scope of the present invention is defined by the appended claims.

Exemplary embodiments herein provide a power consumption metering system 100. The power consumption metering system 100 is deployed at a site to be monitored, for example, a single building or a group of buildings. In the case that multiple buildings are to be monitored, each building may have its own metering system 100.

The power consumption metering system 100 comprises a fuse box 101. The fuse box may be connected to an energy distribution network. The network supplies electrical energy.

The fuse box 101 comprises a main disconnect switch 103. The fuse box 101 further comprises one or more circuit breakers 102.

Electrical energy and/or electrical power can be provided to an power consumer 107 that is arranged at the monitored side. The power consumer 107 may be any consumer, for example lights, air conditioners, heaters, domestic appliances like washing machines or other household appliances, computers, chargers and any other device that is powered by electrical energy.

One or more sensors 104 are connected with the circuit breaker 102 and the disconnect switch 103. According to embodiments, only the circuit breaker 102 is equipped with a sensor 104. According to further embodiments, only the disconnect switch is equipped with a sensor 104.

For example, the sensor 104 is a sensing device based on magnetic flux density emitted by the circuit breaker 102 and/or the disconnect switch 103. This allows a low cost and easy installation, which simplifies the utilization of granular power monitoring systems. According to an embodiment, the sensor 104 is an electromagnetic based monitoring solution. For example, electromagnetic field radiation is detected by the sensor 104. Other types of sensors can be used.

Within the monitored site, the electrical energy supplied by the utility provider is distributed by the number of fuse boxes 101. Typically, the electrical energy provided to any specific endpoint and to the power consumer 107 within the site to be monitored is provided by at least one fuse box 101 and protected by at least one circuit breaker 102. In the exemplary embodiment shown in FIG. 1, the disconnect switch 103 and a multitude of circuit breaker 102 are shown. However, attention is drawn to the fact that the monitored site may contain only circuit breakers 102 and no disconnect switch 103. Furthermore, the monitored side may contain tens, hundreds or even thousands of fuse boxes 101 and/or circuit breakers 102.

In the described embodiment, each of the circuit breakers 102 comprises a corresponding sensor 104 assigned to it. The sensors 104 are placed on the circuit breakers 102 and the disconnect switch 103 in order to monitor the power consumption of the corresponding circuits leading to the electrical consumer 107 and other consumers. According to embodiments, the sensors 104 are mounted directly on the circuit breakers 102 and the disconnect switch 103. According to embodiments, the sensors 104 are mounted in the immediate vicinity of the circuit breakers 102 and the disconnect switch 103 respectively. In different embodiments, the sensors 104 may be associated with individual appliances, groups of circuit breakers, distribution panels, fuse boxes or any other distinct part of the energy distribution network within the site to be monitored.

The sensors 104 are referred to as granular-level sensors. The data they collect can be referred to as granular-level power consumption values.

The sensors 104 are configured to measure power consumption that is assigned to the respective circuit breaker 102, that the power consumer 107 is connected to.

The power consumption metering system 100 comprises an power consumption meter 105. The power consumption meter 105 is a smart meter device. The power consumption meter 105 is connected to the sensors 104. Data of the sensors 104 can be transferred to the power consumption meter 105 for further processing.

The power consumption meter is connected to a cloud-based data processing system 106. The cloud-based data processing system 106 is a system that uses shared computer system resources like processors and memory over the internet.

The cloud-based data processing system 106 and the power consumption meter 105 are connected to each other by a data network. For example, the network is a wireless network or a cable-based network. The network may use different communication standards like TCPIP or the world-wide web.

The sensors 104 are configured to measure the power consumption of the power consumer 107 with a high speed. For example, the resolution of the measuring comprises more than 1000 values per second. According to further embodiments, the resolution comprises more than 2000 values per second. According to further embodiments, the resolution comprises more than 3000 values per second. According to further embodiments, the resolution comprises more than 4000 values per second. According to further embodiments, the resolution comprises more than 5000 values per second. According to further embodiments, the resolution comprises more than 6000 values per second. According to a further embodiment, the resolution comprises more than 7000 values per second.

According to further embodiments, the resolution of the high speed values comprises 8000 values per second or more. For example, the resolution of the high speed value measuring is between 5000 values and 15000 values per second.

The power consumption meter 105 is configured to process the high speed values of the sensors 104.

Figure 2:
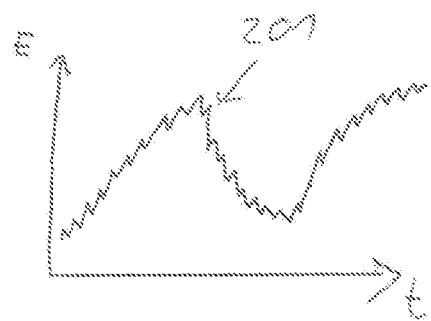
FIG. 2 shows a schematic diagram of a high speed value pattern according to an embodiment.

The power consumption meter 105 is configured to determine a high speed value pattern of power consumption with a resolution of more than 1000 values per second by computing consecutive measuring values of the sensor over time. An exemplary high speed value pattern 201 is shown in FIG. 2.

Figure 4:
FIG. 4 shows a schematic diagram of harmonics of a high speed value pattern according to an embodiment.

The power consumption meter 105 is configured to apply an algorithm to the high speed value pattern. For example, the algorithm is stored on a memory of the power consumption meter 105. According to an embodiment, the algorithm is a fast Fourier transform (FFT). The fast Fourier transform converts the high speed power consumption value pattern, which is a signal from the sensor 104, to a representation in the frequency domain. With the fast Fourier transform one or more harmonics 203 of the high speed value pattern can be determined. Examples of harmonics 203 are shown in FIG. 4. According to a further embodiment, the algorithm is different mathematical method than the fast Fourier transform. Any mathematical method may be used that is suitable to determine the one or more harmonics sufficiently fast. According to a further embodiment, the harmonics are detected using electronics like semiconductor chip.

The harmonics 203 are representative for the high speed value pattern.

Figure 3:
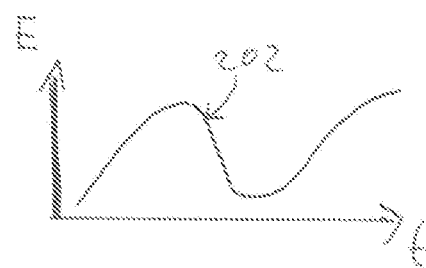
FIG. 3 shows a schematic diagram of a low speed consumption pattern according to an embodiment.

The power consumption meter 104 is configured to measure low speed power consumption values over time dependent on the signal of the sensor 104. A low speed value pattern 202 is determined over time out of consecutive power consumption values. The low speed value pattern comprises a resolution of less than 100 values per second. For example, the low speed value pattern comprises a resolution of 1 value per second. According to further embodiments, the low speed value pattern comprises a resolution of 1 value per 2 seconds. For example, the low speed value pattern comprises a resolution of less than 10 values per second and more than 1 value per 10 seconds. For example, the low speed value pattern comprises a resolution of 1 value per minute or 2 values per minute. An exemplary low speed value pattern 202 is shown in FIG. 3.

The determined harmonics 203 as well as the low speed value pattern 202 are transferred to the cloud-based data processing system 106. By the fact that the harmonics 203 are transferred to the cloud-based data processing system 106 instead of the high speed value pattern 201 itself, the quantity of data that needs to be transferred can be significantly reduced.

The cloud-based data processing system 106 is configured to determine a status of the power consumer 107 dependent on the received harmonics 203 at the received low speed value pattern 202. Each power consumer 107 has a specific power consumption during operation. As part of the power consumption depending on the type of the device, during start-up, operation and shutdown a typical consumption pattern can be taken. The received harmonics 203 and low speed value pattern 202 can be compared to the known consumption pattern. Thus, it is possible to assign a specific power consumption to a specific power consumer 107 even if more than one power consumer 107 is connected to a single circuit breaker 102. For example, the harmonics 203 are used to distinguish different power consumer 107. The low speed value pattern 202 is used to determine the power that is consumed by the specific power consumer 107.

The cloud-based data processing system 106 is configured to take further influencing factors into account. The influencing factors may be factors like weather, temperature, time of day, time of year, type of day, overall power consumption of a monitored side, location and combinations thereof. For example, an air conditioner works differently in summer than in winter and differently on hot than on cold days. Taking the further influencing factors into account when comparing the determined harmonics and/or low speed value pattern 202 allows a more precise identification of the status of the power consumer.

The influencing factors may be factors like historical data of consumption pattern and harmonics. The determined harmonics and power consumption values can be compared to the historical data to determine the status of the power consumer 107. The historical data may be provided by the system 100 itself. Additionally or alternatively, the historical data may be provided by an external third-party provider.

The status of the power consumer 107 may be a status of operation like start-up, operation and shutdown or standby. For example, the status is a switched off status during which the consumer 107 is deactivated. The status may also be a operation cycle. Power consumption and changes in power consumption are known for a given operation cycle. Thus, the current sequential step of the operation cycle can be detected. The status may also be the type of consumer. Also a functionality or malfunction of the power consumer 107 can be identified. When specific harmonics 203 are different from a known consumption pattern of a known power consumer 107, this can be a sign of a malfunction of the power consumer 107. Therefore, a malfunction of the consumer 107 can be detected early.

The result of the identification of the status is transmitted to a user interface 109, no. For example, the user interface 109 is part of a mobile device 108 like a smartphone or a tablet computer. The mobile device 108 is connected to the cloud-based data processing system 106 by a telephone network. Other forms of devices and connections are possible.

For example, the user interface no is a display of the power consumption meter 105. The result and status of the identification of the status computed in the cloud-based data processing system 106 is presented on the user interface no of the power consumption meter 105. The user interface 109, 110 can also comprise a voice output, a light signal or other forms of transfer of information to a human user or a further computer device.

For example, the pattern on start-up contains signatures of the specific power consumer 107 like motor start-up, heater start-up, compressor start-up, that allows a repetitive unique identification of the specific power consumer 107 out of the power consumption stream. The harmonics 203 of the power consumption show an individual signature per power device 107. Timely patterns of consumption lead to an identification of combined operation like a washing machine motor and washing machine heater consuming power at the same time.

The power consumption metering system 100 performs analytics on power demand in terms of patterns and harmonics of a sum of consumption at the disconnect switch 103 or individual circuits of an electrical distribution system. That allows a detailed analysis of operation, status and power consumption of individual power consumers 107 connected to the energy distribution system. Deviations from known signatures in terms of patterns or harmonics allow an indication of health and functionality of devices and thus a predictive maintenance conclusion.

The detailed analysis of the consumption pattern and signatures is possible due to the high speed data analysis and the low speed data analysis performed by the power consumption metering system 100. High speed data has, for example, a sampling rate of 8000 or more samples per second. Furthermore the high speed data analysis is computed with an algorithm that extracts the harmonics 203 by a fast Fourier transform.

Low speed data means a pattern over time analysis such as motor ramp-up of a washing machine until high turns that take multiple seconds.

The combined analysis of the high speed value pattern and the low speed value pattern by the power consumption meter 105 and the cloud-based data processing system 106 allows the analysis of both high speed value pattern and low speed value pattern and extracts and self learns certain pattern behaviors of devices like power consumer 107. The power consumption meter 105 is used for a pre-analysis of the high speed data and aggregate in parallel the low speed power consumption. A result is a harmonics spectrum of the harmonics 203 and a total power consumption. These two values are transmitted to the cloud-based data processing system 106 and also persisted in the power consumption meter 105. The cloud-based data processing system 106 can then analyze the harmonics and the low speed value pattern 202 and the consumption pattern respectively to conclude on device type, status, health and more. The analytics in the cloud-based data processing system 106 can include other findings from other metering data like external data on weather or known device patterns from a database.

The power consumption metering system 100 is capable of metering all circuits in the fuse box 101 or a respective distribution panel and thus has a granular breakdown of that distribution panel. This allows a better performance of the cloud-based data processing system 106 as the diversity of amount of devices running in parallel on individual circuits is limited.

For example, the resolution of the high speed power consumption pattern and/or the resolution of the low speed power consumption pattern can be changed by the cloud-based data processing system 106, for example, dependent on available computing capacity and/or available transmission capacity.

Majority of commercial power consumers 107 require a frequent servicing of the power consumer 107. In order to perform servicing efficiently it is beneficial to have an operation hour counter and consumption tracking system to active inform about servicing requirements.

The power consumption metering system 100 is applied inside an electrical distribution network of the monitored site. The power consumption metering system 100 is tracking power consumption of one or more power consumers 107. A machine learning algorithm detects the consumption patterns of the related power consumer 107.

The status of the consumer 107 whether being switched on or off is determined along power consumption. Energy consumption is an aggregate over time so related. To track the exact time of status the system 100 looks at the power consumption and declare the state at a time. This will conclude status information over time which results finally in operating hours.

For example, it is distinguished between three operation modes: off/standby/operating. More or less states are possible as well. The continuous monitoring extracts an operation time counter for all three states, for example, an operation hour counter or an operation minute counter. Other time periods that are counted are possible as well. The identification of operating mode on/off/standby can be done in the cloud-based data processing system 106 after pattern analysis. The criteria of that determination can be also loaded into the power consumption meter 105 for local execution and provide the result of the operation time counter to any other connected device.

Furthermore the power consumption metering system 100 is tracking the consumption patterns and deviations from statistics, e.g., on historical data, average consumption values, external data of the power consumer 107 and combinations thereof. The deviations can be determined on the consumption level and/or the consumption patterns. This allows a maintenance alert in case the electrical consumer 107 is changing behavior over time or abrupt. For example, a power consumption of the power consumer 107 outside of a defined operation time can be detected, for example, a power consumption outside of given opening hours. The historical data may be provided by a third-party provider.

According to further embodiments, a reference pattern is provided. The determined value patter is compared with the reference pattern to detect a deviation of the real power consumption to an intended power consumption. The reference pattern may be provided by the system 100 itself. Additionally or alternatively, the reference pattern may be provided by an external third-party provider. The deviation from the reference pattern might be structural or temporal. For example, a recurring effect on frequent base that doesn't appear to happen at expected time is detected as a deviation from the associated reference pattern.

A centralized database, e.g., of the cloud based data processing system 106, keeps record of states and operation hours per power consumer 107 and can be configured to actively inform about servicing requirements. For example, the information is output via one or both of the user interfaces 109, 110.

Furthermore the power consumption metering system 100 can overlay information about regular patterns occur or not.

Furthermore the power consumption metering system 100 can detect whether specific operation modes occur or not, for example, maintenance operation modes. Specific operation modes comprise specific value pattern of power consumption. For example, dependent on the value pattern it is detectable whether a planned and/or specified cleaning cycles of a food processors is executed as desired or not. A user can be notified about the regular execution and an alert can be output in case of a missing or incorrect execution.

According to an embodiment, the cloud based data processing system 106 provides a specification for the operation time for the power consumer 107 to the power consumption meter 105. The power consumption meter 105 compares the specification with counted operation time. The power consumption meter 105 can send a measuring signal and/or a control signal to a local control device, for example, of the power consumer 107, if the counted operation time exceeds the specification. Thus, it is possible that the system 100 provides a functionality for control tasks even in times without a direct connection to the cloud based data processing system 106.

According to an embodiment, there is an installation setup that a power line comes with multiple power consumers 107 connected to a single circuit-breaker 102. For example, ten lighting fixtures are fed by one power cord. The system 100 can be reached this as setup item and detect a failure of one consumer 107 of the multiple consumers 107. For example, a failure of one consumer 107 is detected as $1/10$ of power consumption goes down.

The value pattern can be measured and obtained as explained with respect to the low speed value pattern and the high speed value pattern. For example, the identification of the power consumer 107 is executed with the aid of the high speed value pattern. The operation time counting is, for example, executed with the aid of the low speed value pattern, in particular for the different types of operation time. Other forms of obtaining the value pattern are possible. For example, only one of the high speed pattern and the low speed pattern is obtained. According to further embodiments, other forms of determining the value pattern of power consumption are possible, for example, an aggregation of consumption values over time or a determining of a function of the consumption values over time.

For example, the cloud based data processing system 106 provides a configuration which signal thresholds and/or signal pattern 201, 202 correspond to which status of the power consumer 107. The configuration is, for example, provided for the power consumption meter 105. The power consumption meter 105 records and/or transmits the operation times to the cloud based data processing system 106.

The system 100 can also overlay information from the operation time counter to the extend to also count the number of switch-on cycles. Those switch-on events count up over time and give insight into usage of consumer 107.

The sensor 104 together with the power consumption meter 105 and the cloud bases data processing system 106 allows a detailed operation time counting based on the consumption value pattern. No additional sensor needs to be applied to electrical devices that should be monitored. Only the metering information of the power consumption metering system 100 is required to extract the desired information per device 107. In this way, information can be derived via analysis of the power consumption data. The information comprises one of more of an operation hour counter, a regular electrical pattern identification, an abnormal conditions identification, an identification of a deviation from known pattern or consumption levels, an identification of patterns and device recognition and a combination thereof.

The power consumption metering system 100 allows sum metering of power consumption together with a breakdown of the power consumption on a detailed device level. Furthermore a status of the devices such as time of operation or health can be determined by the power consumption metering system 100.

What is claimed is:

1. A method for operating a power consumption metering system, the method comprising:
    measuring, by a sensor deployed at a monitored site, power consumption values over time to obtain a high speed value pattern of a power consumption with a resolution of more than 1000 values per second, wherein the power consumption values are harmonics obtained from a Fourier transformation;
    measuring, by the sensor, consecutive low speed power consumption values over time to obtain a low speed value pattern of the power consumption with a resolution of less than 100 values per second;
    identifying a status of a power consumer of the monitored site dependent on the high speed value pattern; and
    counting an operation time of the power consumer dependent on the low speed value pattern and on the identified status.

2. The method according to claim 1,
    wherein the status comprises states off, standby and operating, and
    wherein counting the operation time comprises:
        counting a first operation time for the state off,
        counting a second operation time for the state standby, and
        counting a third operation time for the state operating.

3. The method according to claim 1, further comprising:
    providing a reference consumption for the power consumption; and
    notifying a user when the power consumption deviates from the reference consumption more than a given tolerance.

4. The method according to claim 1, further comprising:
    providing maintenance information for the power consumer; and
    notify a user about maintenance requirements dependent on the maintenance information and the counted operation time.

5. The method according to claim 1, further comprising:
    providing information about a specific operation mode;
    identifying execution to a specific operation dependent on the high speed value pattern; and
    notifying a user when the specific operation mode has been executed.

6. The method according to claim 1, further comprising:
    providing information about a specific operation mode;
    identifying execution to a specific operation dependent on the high speed value pattern; and
    notifying a user when the specific operation mode has not been executed.

7. The method according to claim 1, further comprising outputting the counted operation time on a user interface, wherein the user interface comprises a display.

8. The method according to claim 1, wherein the sensor is configured to measure granular-level power consumption values of the power consumer.

9. The method according to claim 1, further comprising:
    identifying a status of a plurality of power consumers of the monitored site dependent on the high speed value pattern; and
    counting a respective operation time of each power consumer dependent on the identified status.

10. The method according to claim 1, wherein the power consumption metering system comprises a cloud-based data processing system.

11. The method according to claim 1, further comprising:
    providing a reference pattern for the high speed value pattern; and
    notifying a user when the high speed value pattern deviates from the reference pattern more than a given tolerance.

12. A power consumption metering system comprising:
    a sensor deployed at a monitored site, wherein the sensor is configured to:
    measure power consumption values over time to obtain a high speed value pattern of a power consumption with a resolution of more than 1000 values per second, wherein the power consumption values are harmonics obtained from a Fourier transformation; and
    measure consecutive low speed power consumption values over time to obtain a low speed value pattern of the power consumption with a resolution of less than 100 values per second; and
    a data processing system configured to identify a status of a power consumer of the monitored site dependent on the high speed value pattern,
    wherein the power consumption metering system is configured to count an operation time of the power consumer dependent on the low speed value pattern and the identified status.

13. The power consumption metering system according to claim 12,
    wherein the status comprises states off, standby and operating,
    wherein the operation time is counted by:
        counting a first operation time for the state off;
        counting a second operation time for the state standby; and
        counting a third operation time for the state operating.

14. The power consumption metering system according to claim 12, wherein the data processing system is further configured to:

providing a reference consumption for the power consumption, and notify a user when the power consumption deviates from the reference consumption more than a given tolerance.

15. The power consumption metering system according to claim 12, wherein the data processing system is further configured to:

provide maintenance information for the power consumer, and notify a user about maintenance requirements dependent on the maintenance information and the counted operation time.

16. The power consumption metering system according to claim 12, wherein the data processing system is further configured to:

provide information about a specific operation mode, identify execution to a specific operation dependent on the high speed value pattern, and notify a user when the specific operation mode has been executed.

17. The power consumption metering system according to claim 12, wherein the data processing system is further configured to:

provide information about a specific operation mode, identify execution to a specific operation dependent on the high speed value pattern, and notifying a user when the specific operation mode has not been executed.

18. The power consumption metering system according to claim 12, further comprising a user interface to output the counted operation time.

19. The power consumption metering system according to claim 18, further comprising a mobile device, wherein the user interface is part of the mobile device.

20. The power consumption metering system according to claim 12, wherein the data processing system is further configured to:

identify a status of a plurality of power consumers of the monitored site dependent on the high speed value pattern, and count a respective operation time of each power consumer dependent on the identified status.

21. The power consumption metering system according to claim 12, wherein the data processing system is a cloud-based data processing system.

22. The power consumption metering system according to claim 12, wherein the data processing system is further configured to:

provide a reference pattern for the high speed value pattern, and notify a user when the high speed value pattern deviates from the reference pattern more than a given tolerance.

* * * * *